(12) United States Patent
Wöhrle et al.

(10) Patent No.: US 8,553,052 B2
(45) Date of Patent: Oct. 8, 2013

(54) DISPLAY DEVICE

(75) Inventors: Siegbert Wöhrle, Schiltach (DE); Daniel Schultheiss, Hornberg (DE); Josef Fehrenbach, Haslach (DE); Thomas Deck, Wolfach (DE); Michael Fischer, Wolfach (DE)

(73) Assignee: Vega Grieshaber KG, Wolfach (DE)

( * ) Notice: Subject to any disclaimer, the term of this patent is extended or adjusted under 35 U.S.C. 154(b) by 611 days.

(21) Appl. No.: 12/840,706

(22) Filed: Jul. 21, 2010

(65) Prior Publication Data
US 2011/0057962 A1    Mar. 10, 2011

Related U.S. Application Data

(60) Provisional application No. 61/241,451, filed on Sep. 11, 2009.

(30) Foreign Application Priority Data

Sep. 7, 2009 (EP) ..................... 09011425

(51) Int. Cl.
G09G 5/10 (2006.01)
G09G 3/04 (2006.01)
G09G 3/14 (2006.01)

(52) U.S. Cl.
USPC ............................ 345/690; 345/33; 345/46

(58) Field of Classification Search
USPC ............................................. 345/690, 33, 46
See application file for complete search history.

(56) References Cited

U.S. PATENT DOCUMENTS

| 4,348,666 A | 9/1982 | Ogita |
| 4,461,175 A * | 7/1984 | Baumgart et al. .............. 73/295 |
| 2005/0248409 A1 | 11/2005 | Eck et al. |

FOREIGN PATENT DOCUMENTS

| DE | 2251 822 | 3/1973 |
| DE | 2614712 | 10/1977 |
| EP | 1 656 001 A1 | 11/2004 |

OTHER PUBLICATIONS

European Appln. No. 09011425.7 dated Nov. 12, 2009, Search Report, 9 pages with English translation 3 pages.
Application Note Booklet, Philips Semiconductors, Jul. 22, 2002, Entitled: AN264 I²C Devices for LED Display Control, 27 pages.

* cited by examiner

*Primary Examiner* — Alexander S Beck
*Assistant Examiner* — Joseph Pena
(74) *Attorney, Agent, or Firm* — Andrew F. Young, Esq.; Lackenbach Siegel, LLP

(57) ABSTRACT

Display device, with a plurality of display elements arranged in the shape of a bar, wherein each display element can represent at least one first display state (off) and one second display state (on), and a value being shown can be indicated by the second display state (on) of at least one display element assigned to the value, so that an intermediate value between the value being displayed and a succeeding or preceding value can be represented by activating the preceding or succeeding display element.

16 Claims, 2 Drawing Sheets

□ LED off
▨ LED on, reduced intensity
■ LED on

DISPLAY DEVICE

CROSS REFERENCE TO RELATED APPLICATIONS

This application claims priority from European Patent Application Serial No. EP 09 011 425.7, filed Sep. 7, 2009, and U.S. Provisional Patent Application Ser. No. 61/241,451, filed Sep. 11, 2009, the entire contents of each of which is herein incorporated fully by reference.

FIGURE FOR PUBLICATION

FIG. 3

BACKGROUND OF THE INVENTION

1. Field of the Invention

The present invention relates to a display device. More specifically, the present invention relates to a display device which ensures ease of use and reliable and legible display with an enlarged range of values.

2. Description of the Related Art

Such display devices are known from the prior art as "progress meters". The known progress meters consist of a number of bar-shaped display elements arranged in a row, while either an individual display element assigned to the value or all display elements up to the display element assigned to the value are activated to display a particular value.

Referring now to FIGS. 1A and 1B, which show such display devices known from the conventional art, there is first shown FIG. 1A which shows a progress meter 1 with seven display elements 2, wherein each time only one of the display elements 2 is activated to show a value. Thus, with the display device of FIG. 1A, the seven display elements 2 can distinctly show precisely seven conditions.

FIG. 1B shows the second known configuration variant of such display devices 1, in which to show a particular value all display elements 2 are activated starting from one end of the display elements 2 arranged as a bar, up to a display element 2 assigned to the value being indicated. In the example shown in FIG. 1B, seven display elements 2 also can clearly display at most seven values or conditions.

Furthermore, it is known from the prior art how to encode the values being displayed and also how to perform the display in encoded manner. For example, measurement values being displayed can be binary encoded and displayed according to this encoding. The individual display elements in a binary encoding are each assigned to powers of two, so that with seven display elements there can be shown a maximum of 27, i.e., 128 values. However, such an encoding comes at the expense of easy legibility, so that encoding cannot be used in application realms where a fast, precise and easy legibility needs to be assured.

What is not appreciated by the prior art is the problem of providing a display device which assures an easy, reliable and fast legibility, yet enables the displaying of an enlarged range of values.

Accordingly, there is a need solved by a display device with the features of proposed invention including an alternative actuation device relating to the same.

SUMMARY AND ASPECTS OF THE INVENTION

An aspect of the present invention is to provide a display device which according to one aspect of the present invention has a plurality of display elements arranged in the shape of a bar, and each display element can represent at least one first display state and one second display state, and a particular value can be indicated by the second display state of at least one particular display element, while an intermediate value between the particular value and a succeeding or preceding value can be represented by activating the preceding or succeeding display element.

The present invention thus, on the one hand, makes use of the easy legibility of progress meters and, on the other hand, makes it possible to represent intermediate values by the activating of a preceding or succeeding display element. If an individual value being represented is represented by the activation of an individual display element, intermediate states between the value being represented and a succeeding value can be represented by simultaneous activation of the display element assigned to the value being represented and the succeeding display element. A display with, say, seven display elements can thus show, in addition to the seven formerly representable values, six additional intermediate values, so that in all a display of 13 different conditions is possible.

According to a further modification of the invention, it is possible to show a third display condition by each display element for display of the intermediate values.

Thanks to a third display condition, which can be realized when using light emitting diodes (LEDs) as display elements, for example, by an actuation of the light emitting diodes at half brightness, it is likewise possible to represent further display conditions yet still ensure the fast and distinct legibility of a progress meter.

This is possible, for example, in that the value being shown is represented by the second state of a display element assigned to this value and all preceding display elements and the intermediate value to the succeeding value is signaled by the further activation of the succeeding display element in the third state, i.e., for example, with half brightness.

Such a display device has the advantage that one can recognize at a glance, thanks to the number of light emitting diodes (LEDs), the region in which the value being displayed is located; and, furthermore, one instantly recognizes, by a direct comparison, whether an additional light emitting diode (LED) is operating at full or half brightness.

A further display possibility is given in that a value being displayed can be represented by activation of an individual display element and the intermediate value to the succeeding or the preceding value can be represented by the third state of the succeeding or preceding display element.

In this way, it is possible to signal a total of 21 states with seven display elements, wherein each time it is possible, starting from a value being displayed, to represent an intermediate value below and an intermediate value above the value being displayed. The advantage of this variant is that a substantially increased number of values can be represented with continued good legibility. As compared to a traditional display device of the prior art, one can show three times (300%) as many values, so that only a third of the material expense is incurred for the display device as compared to the conventional art.

While not limiting to the scope and spirit of the present invention, an especially simple realization of the above-described display devices can be achieved with light emitting diodes (LEDs), which are actuated in three brightness stages.

An actuation circuit is provided for the actuating of the display elements or light emitting diodes (LEDs).

A preferred area of application of the above described display device is in the field of fill-level meters, since a clear and fast legibility plays a large role especially in this field of application.

The actuation circuit for the above described display device is preferably configured so that the first state of the display device is actuated by a first current strength, the second state by a second current strength and the third state by a third current strength. The third current strength lies between the first current strength and the second current strength, which when using light emitting diodes corresponds to a diode mode with reduced brightness.

In an actuation of light emitting diodes, the second current strength roughly amounts to the current rating of the diode, the first current strength is around 0 amperes and the third current strength is adjusted in the range of half the current rating of the diode.

In addition to an "on state" at the current rating and an "off state" at 0 amperes, a third state with around half brightness at around half current rating is thereby achieved. The third state, on the one hand, is easily perceptible as compared to a light emitting diode (LED) that is switched off, and on the other hand it can also be well distinguished from a light emitting diode (LED) operating at the current rating.

Such an actuation circuit can be realized, for example, with a microprocessor having one output each for actuating each display element, wherein each of the outputs can take on a first output state, a second output state and a third output state. To actuate the display elements, which are realized as light emitting diodes (LEDs), one input circuit is provided for each of the light emitting diodes. The input circuit is built from a transistor, whose base is connected to the output of the microprocessor and across a first resistor to a power supply voltage. The collector of the transistor is connected across a second resistor likewise to the power supply voltage. The emitter of the transistor is connected to ground across a series circuit of a third resistor and the light emitting diode (LED).

Thanks to such an actuation circuit, it is possible to actuate a light emitting diode (LED) with three different brightness stages using only one output of the microprocessor. For this, one uses the three states of a tri-state output of the microprocessor.

In the first state, the output of the microprocessor is switched to ground, so that no current can flow across the transistor. The light emitting diode (LED) is off In the second state, the output of the microprocessor is hooked up to the power supply voltage, so that the sum of a base current and a collector current of the transistor flows through the light emitting diode (LED). The light emitting diode (LED) is operated at full brightness. In the third state, the output of the microprocessor is switched to be high-resistance, so that the base current of the transistor can be adjusted by the first resistor. The light emitting diode (LED), given suitable dimensions of the resistor, is operated dimmed, preferably at half brightness.

The present invention relates to a display device, with a plurality (n) of display elements arranged in the shape of a bar, wherein each display element can represent at least one first display state (off) and one second display state (on), and a value being shown can be indicated by the second display state (on) of at least one display element assigned to the value, so that an intermediate value between the value being displayed and a succeeding or preceding value can be represented by activating the preceding or succeeding display element.

According to an optional embodiment of the present invention, there is provided a display device, with a plurality (n) of display elements arranged in the shape of a bar, wherein each display element can represent at least one first display state (off) and one second display state (on), and a value being shown can be indicated by the second display state (on) of at least one display element assigned to the value, characterized in that an intermediate value between the value being displayed and a succeeding or preceding value can be represented by activating the preceding or succeeding display element.

According to another optional embodiment of the present invention there is provided an actuation circuit for a display device configured so that the first state (off) of the display device is actuated by a first current strength (I1), the second state (on) by a second current strength (I2) and the third state (t) by a third current strength (I3), while the third current strength (I3) lies between the first current strength (I1) and the second current strength (I2), and further optionally configured with a microprocessor (µP) having one output each for actuating each display element (2), with a first output state (low), a second output state (high) and a third output state (in) and one input circuit for each of the display elements (2) with a transistor (T), whose base is connected to the output of the microprocessor (µP) and across a first resistor (R1) to a power supply voltage (UB), whose collector (C) is connected across a second resistor (R2) to the power supply voltage (UB), while the emitter (E) is connected to ground (GND) across a series circuit of a third resistor (R3) and a light emitting diode as the display element (2).

According to another optional embodiment of the present invention, there is presented a method of using a display device, comprising the steps of: providing a display device with a plurality (n) of display elements arranged in the shape of a bar, wherein each display element can represent at least one first display state (off) and one second display state (on), and displaying a value which can be indicated by the second display state (on) of at least one display element assigned to the value, characterized in that: an intermediate value between the value being displayed and a succeeding or preceding value is represented by activating at least one of the preceding or succeeding display element.

According to another optional embodiment of the present invention, there is provided an actuation circuit for a display device, comprising: a plurality (n) of display elements arranged in the shape of a bar, wherein each display element can represent at least one first display state (off) and one second display state (on); and a value being shown can be indicated by the second display state (on) of at least one display element assigned to the value, characterized in that: an intermediate value between the value being displayed and at least one of a succeeding or preceding value can be represented by activating the preceding or succeeding display element; and said actuation circuit being configured so that the first state (off) of the display device is actuated by a first current strength (I1), the second state (on) by a second current strength (I2) and the third state (t) by a third current strength (I3), while the third current strength (I3) lies between the first current strength (I1) and the second current strength (I2).

The above, and other aspects, features and advantages of the present invention will become apparent from the following description read in conjunction with the accompanying drawings, in which like reference numerals designate the same elements.

BRIEF DESCRIPTION OF THE DRAWINGS

FIG. 1A is a first progress meter according to the prior art.

FIG. 1B is a second progress meter according to the prior art.

FIG. 2A is a first sample embodiment of a progress meter according to the present invention.

FIG. 2B is a second sample embodiment of a progress meter according to the present invention.

FIG. 2C is a third sample embodiment of a progress meter according to the present invention.

DETAILED DESCRIPTION OF THE PREFERRED EMBODIMENTS

Figure 3:
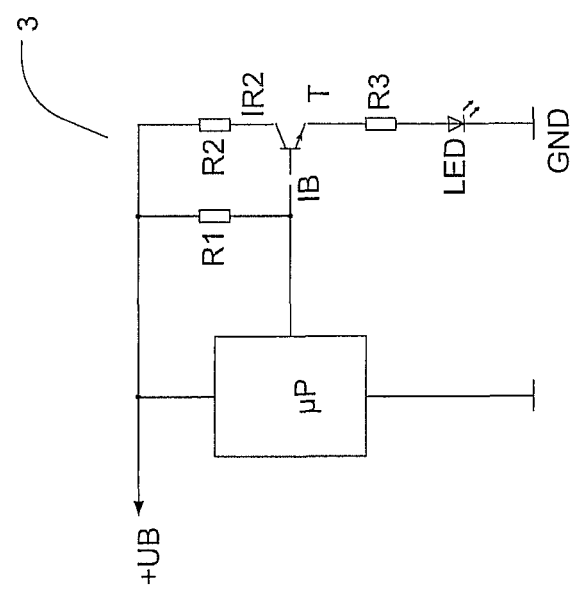
FIG. 3 is an actuation circuit for a display element of a display device according one aspect of the present invention.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Figures 1A, 1B, 2A, 2B, 2C:
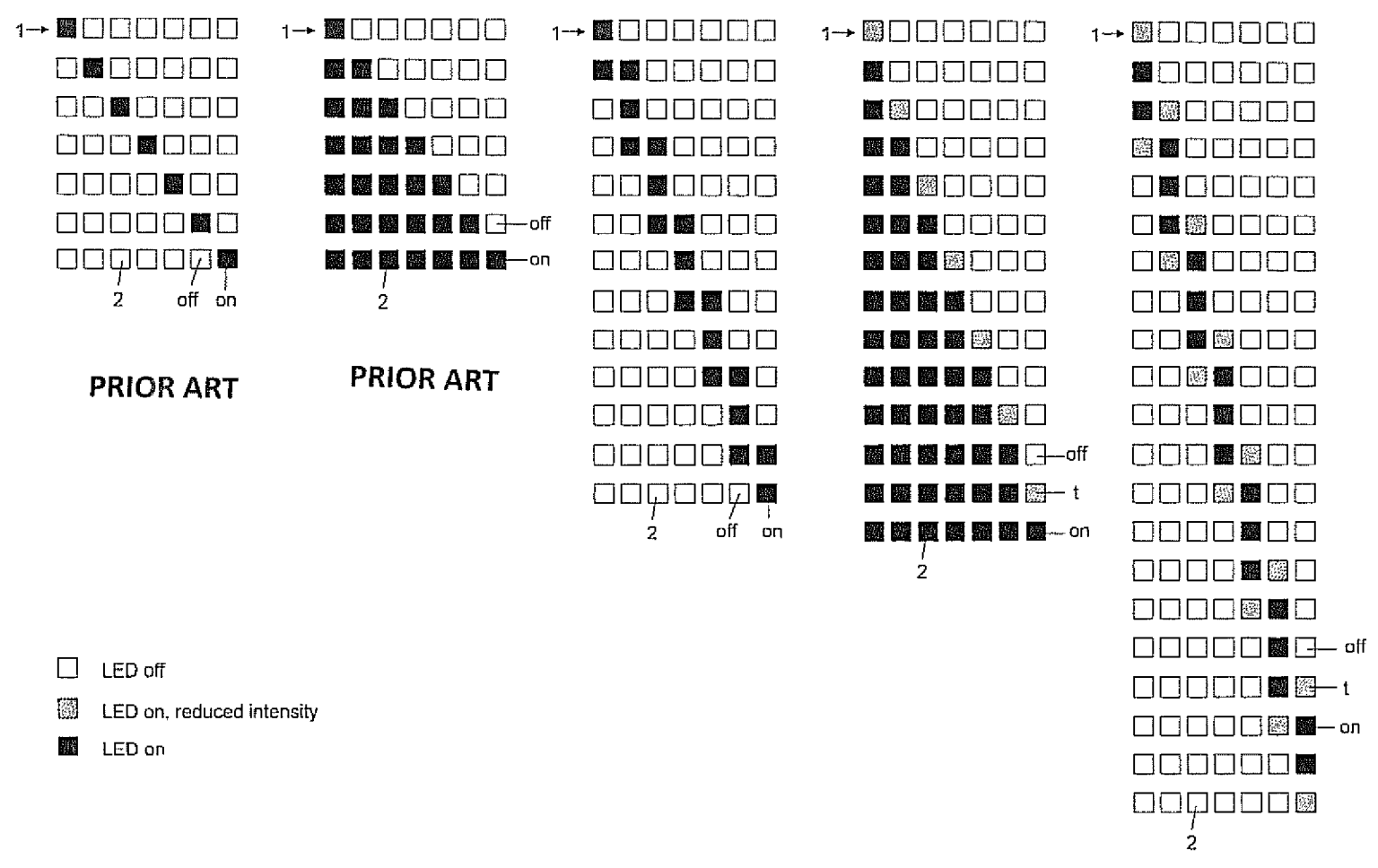

Referring now to FIGS. 2A through 2C, each shows a display device 1 with seven display elements 2 arranged in the form of a bar (shown horizontally here but not limited thereto), wherein different display methods are used each time to achieve an enlarged display range as compared to traditional progress meters with seven display elements 2.

FIG. 2A shows the different display states of a display device 2 in which a value being displayed is accomplished by activating a display element 2 assigned to the value. Intermediate values between a value being displayed and a succeeding value are displayed by activating the display element 2 coming after the assigned display element 2.

If, for a non-limiting example, the values 1 to 7 are displayed by the display device 1 with seven display elements 2, then a value of, say, 2.5 can be represented by activating the second and third display element 2. Thus, by representing the intermediate values it is possible to represent a maximum of 13 display stages in all.

FIG. 2B shows the various display states of another sample embodiment of the display device 1 of the invention. In this embodiment, a value being displayed is accomplished by the activation of the display element 2 assigned to the value, as well as all preceding display elements 2. Intermediate values to a succeeding value are signaled by an activation of the succeeding display element 2 with reduced intensity, i.e., half intensity, for example.

A value of, say, 2.5 is thus represented by an activation of the first and second display element 2 with full intensity and an activation of the third display element 2 with half intensity.

If, in addition, it is provided that the first display element 2 can operate at full intensity and half intensity, this will produce an additional display state, so that a total of 14 display states can be represented with the display device shown in FIG. 2B.

FIG. 2C shows the various display states of another sample embodiment of a display device of the invention.

In this third sample embodiment, a value being displayed is represented by activation of a single display element, while intermediate values to a preceding or a succeeding value are represented by activation of the preceding or succeeding display element. It is thereby possible to show two intermediate states between a value being displayed and a succeeding value. For example, the values $2\frac{1}{3}$ can be represented by activation of the second display element at full intensity and activation of the third display element with half intensity and the value $2\frac{2}{3}$ by activation of the third display element with full intensity and by activation of the second display element 2 with half intensity.

With the indicated encoding process, it is possible to display up to 21 gradations with a progress meter comprising seven display elements.

The sample display values indicated serve solely to illustrate the display variant described each time.

Referring now to FIG. 3, which shows an actuation circuit 3 for a corresponding display element 2, making it possible to actuate a light emitting diode used as a display element 2 in three brightness stages, namely, with full brightness, with reduced brightness, and in an off state.

With the actuation circuit 3, according to the invention, it is possible to actuate a light emitting diode (LED) in three brightness stages, requiring only one output of the microprocessor μP for this.

The actuation circuit 3, according to the invention, comprises a microprocessor μP whose tri-state output is connected to the base B of a bipolar transistor T. Between the base B and a power supply voltage UB is arranged a first resistor R1. The collector C of the bipolar transistor T is connected across a second resistor R2 to the power supply voltage UB as well. Between a ground lead GND and the emitter E of the bipolar transistor T is arranged a series circuit of a third resistor R3 and a light emitting diode (LED) as the display element 2.

The tri-state output of the microprocessor μP can take on three different states to actuate the bipolar transistor T. In a first state "low", the output is switched to ground GND or 0 volts, so that no current can flow across the bipolar transistor T. The light emitting diode (LED) is therefore off. In a second output state "high", the output of the microprocessor μP is switched to the power supply voltage UB, so that the light emitting diode (LED) is actuated with the sum of the base current IB and a current IR2 flowing across the second resistor R2. The light emitting diode LED shines with great brightness. In a third state "in", the output of the microprocessor μP is switched as the input and therefore is high resistance. In this state, the base current IB across the first resistor R1 can be adjusted via the bipolar transistor T so that the light emitting diode (LED) shines with reduced brightness.

The novel features that are considered characteristic of the invention are set forth with particularity in the appended claims. The invention itself, however, both as to its structure and its operation together with the additional aspects and advantages thereof will best be understood from the description of the preferred embodiments of the present invention when read in conjunction with the accompanying drawings. Unless specifically noted, it is intended that the words and phrases in the specification and claims be given the ordinary and accustomed meaning to those of ordinary skill in the applicable art or arts. If any other meaning is intended, the specification will specifically state that a special meaning is being applied to a word or phrase. Likewise, the use of the words "function" or "means" in the Description of Preferred Embodiments is not intended to indicate a desire to invoke the special provision of 35 U.S.C. 112, paragraph 6 to define the invention. To the contrary, if the provisions of 35 U.S.C. 112, paragraph 6, are sought to be invoked to define the invention(s), the claims will specifically state the phrases "means for" or "step for" and a function, without also reciting in such phrases any structure, material, or act in support of the function. Even when the claims recite a "means for" or "step for" performing a function, if they also recite any structure, material or acts in support of that means of step, then the intention is not to invoke the provisions of 35 U.S.C. 112, paragraph 6. Moreover, even if the provisions of 35 U.S.C. 112, paragraph 6, are invoked to define the inventions, it is intended that the inventions not be limited only to the specific structure, material or acts that are described in the preferred embodiments, but in addition, include any and all structures, materials or acts that perform the claimed function, along with any and all known or later-developed equivalent structures, materials or acts for performing the claimed function.

As noted, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In the drawings and specification, there have been disclosed typical embodiments of the invention and, although specific terms are employed, they are used in a generic and descriptive sense only and not for purposes of limitation, the scope of the invention being set forth in the following claims.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A display device, said display device further comprising:
a plurality of display elements arranged in the shape of a bar, and wherein each one of said plurality of display elements can represent at least one first display state and one second display state;
a value being shown by said display device can be indicated by said second display state utilizing at least one display element assigned to said value, and an intermediate value between said value being displayed and a succeeding or a preceding value can be represented by activating a corresponding preceding or a corresponding succeeding display element;
an actuation circuit;
wherein said actuation circuit allows:
a first current strength actuates said first state;
a second current strength actuates said second state; and
a third current strength actuates said third state;
while said third current strength lies between said first current strength and said second current strength;
said actuation circuit comprising:
a microprocessor having one output each for actuating each display element, said microprocessor further comprising:
a first output state;
a second output state; and
a third output state; and
an input circuit for each of said display elements, said input circuit further comprising a transistor, whose base is connected to the output of said microprocessor and across a first resistor to a power supply voltage, whose collector is connected across a second resistor to said power supply voltage, while an emitter is connected to ground across a series circuit of a third resistor and a light emitting diode as said display element.

2. A display device according to claim 1, wherein a third display state can be represented by said each display element so as to display a set of one or more intermediate values.

3. A display device according to claim 2, wherein said value being displayed can be represented by said second state of said assigned display element and all preceding display elements, and said intermediate value to said succeeding value can be represented by said second state of said corresponding display element and all preceding display elements, as well as said third state of said succeeding display element.

4. A display device according to claim 1, wherein said value being displayed can be represented by said second state of said corresponding display element, and said intermediate value to said succeeding value can be represented by said second state of said corresponding display element and of said succeeding display element.

5. A display device according to claim 2, wherein said value being displayed can be represented by said second state of said corresponding particular display element and said intermediate value to the succeeding or the preceding value can be represented by said third state of said succeeding or said preceding display element.

6. A display device according to claim 1, wherein said display elements are light emitting diodes (LEDs).

7. A display device according to claim 1, wherein said states of said display elements are brightness values of said display elements.

8. A display device according to claim 1, wherein said display device is a subset of a fill level meter.

9. An actuation circuit according to claim l, wherein:
(a) a current rating value of a light emitting diode (LED) used as said display element is approximate in value to said second current strength;
(b) a current strength for said first current is approximate in value to 0 amperes; and
(c) an approximate value of one half of the current rating of said light emitting diode (LED) corresponds to said third current strength.

10. A display device, said display device comprising:
(a) a plurality of display elements arranged in the shape of a bar, wherein each of said plurality of display elements can represent at least one first display state and one second display state; and
(b) a value being shown can be indicated by said second display state of at least one display element assigned to said value, and wherein:
(i) an intermediate value between said value being displayed and at least one of a succeeding or a preceding value can be represented by activating said preceding or said succeeding display element;
(ii) a third display state can be represented by said each display element to display a corresponding intermediate value;
(c) an activation circuit;
(d) wherein said actuation circuit being configured so that said first state of said display device is actuated by a first current strength, said second state is actuated by a second current strength, and said third state is actuated by a third current strength, while said third current strength lies between said first current strength and said second current strength; and said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

11. A display device comprising a plurality of display elements arranged in the shape of a bar; and, wherein:
(a) each display element of said plurality of display elements can represent at least one first display state and one second display state;
(b) a value being displayed by said display device can be indicated by said second display state of at least one display element assigned to said value;
(c) an intermediate value between the value being displayed, and at least one of a succeeding value or a preceding value, can be represented by activating a corresponding preceding or a corresponding succeeding display element;
(d) a third display state can be represented by said each display element to display each of said intermediate values; and
(e) said value being displayed can be represented by said second display state of said assigned display element and each of said corresponding preceding display elements,
(f) said intermediate value to said corresponding succeeding value can be represented by said second state of said assigned display element and each of said corresponding preceding display elements, as well as said third state of said corresponding succeeding display element; and
(g) an activation circuit, wherein said actuation circuit being configured so that said first state of said display device is actuated by a first current strength, said second state is actuated by a second current strength, and said third state is actuated by a third current strength, while said third current strength lies between said first current strength and said second current strength; and said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

12. A display device comprising a plurality of display elements arranged in the shape of a bar; and, wherein:
(a) each display element can represent at least one first display state and one second display state;
(b) a value being shown can be indicated by said second display state of at least one display element assigned to said value,
(c) an intermediate value between said value being displayed and at least one of a corresponding succeeding or a corresponding preceding value can be represented by activating said corresponding preceding or said corresponding succeeding display element;
(d) said value being displayed can be represented by said second state of said assigned display element and each of said preceding display elements, and said intermediate value to said corresponding succeeding value can be represented by said second state of said assigned display element and each of said preceding display elements, as well as said third state of said corresponding succeeding display element; and
(e) an activation circuit, wherein said actuation circuit being configured so that said first state of said display device is actuated by a first current strength, said second state is actuated by a second current strength, and said third state is actuated by a third current strength; while said third current strength lies between said first current strength and said second current strength; and said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

13. A display device comprising a plurality of display elements arranged in the shape of a bar; and, wherein:
(a) each one of said plurality of display elements can represent at least one first display state and one second display state;
(b) a value being shown can be indicated by said second display state of at least one display element assigned to said value;
(c) an intermediate value between the value being displayed and at least one of a corresponding succeeding or a corresponding preceding value can be represented by activating said corresponding preceding or said corresponding succeeding display element;
(d) said value being displayed can be represented by said second state of said assigned display element, and said intermediate value to said corresponding succeeding value can be represented by said second state of said assigned display element and of said corresponding succeeding display element; and
(e) an activation circuit, wherein said actuation circuit being configured so that said first state of said display device is actuated by a first current strength, said second state is actuated by a second current strength, and said third state is actuated by a third current strength, while said third current strength lies between said first current strength and said second current strength; and said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

14. A display device comprising a plurality of display elements arranged in the shape of a bar; and, wherein:
(a) each display element of said plurality of display elements can represent at least one first display state and one second display state;
(b) a value being shown by said display can be indicated by said second display state of at least one display element assigned to said value;
(c) an intermediate value between said value being displayed and at least one of a corresponding succeeding or a corresponding preceding value can be represented by activating said corresponding preceding or said corresponding succeeding display element; and, wherein
(d) said value being displayed can be represented by said second state of said particular display element and said intermediate value to said corresponding succeeding or said corresponding preceding value can be represented by a third state of said corresponding succeeding or said corresponding preceding display element; and
(e) an activation circuit, wherein said actuation circuit being configured so that said first state of said display device is actuated by a first current strength, said second state is actuated by a second current strength, and said third state is actuated by a third current strength, while said third current strength lies between said first current strength and said second current strength; and
said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

15. A method of using a display device, said method comprising the steps of:
(a) providing a display device with a plurality of display elements arranged in the shape of a bar, wherein each display element can represent at least one first display state and one second display state;
(b) displaying a value which can be indicated by the second display state of at least one display element assigned to the value;
(c) activating at least one of a preceding or a succeeding display element so as to represent an intermediate value between the value being displayed and said succeeding or said preceding value;
wherein a third display state is represented by said each display element to display said intermediate values; and
(d) providing an activation circuit;
(e) operating an activation circuit;
wherein said actuation circuit being configured so that said first state of said display device is actuated by a first current strength, said second state is actuated by a second current strength, and said third state is actuated by a third current strength, while said third current strength lies between said first current strength and said second current strength; and
said actuation circuit further comprising:
(1) a microprocessor having one output each for actuating each display element, with a first output state, a second output state and a third output state; and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

16. An actuation circuit for a display device, said actuation circuit comprising:
(a) a plurality of display elements arranged in the shape of a bar, wherein each one of said plurality of display elements can represent at least one first display state and one second display state; and
(b) a value being shown can be indicated by said second display state of at least one display element assigned to said value,
(c) an intermediate value between said value being displayed and at least one of a corresponding succeeding or a corresponding preceding value can be represented by activating said corresponding preceding or said corresponding succeeding display element;
(d) wherein said actuation circuit being configured so that said first state of said display device is actuated by a first current strength, said second state is actuated by a second current strength, and a third state is actuated by a third current strength, while said third current strength lies between said first current strength and said second current strength; and
said actuation circuit further comprising:
(1) a microprocessor having one output each for actuating each display element, with a first output state, a second output state and a third output state: and
(2) an input circuit, for each of said display elements, with a transistor, whose base is connected to said output of said microprocessor and across a first resistor to a power supply voltage, whose collector is connected across a second resistor to said power supply voltage, while an emitter is connected to ground across a series circuit of a third resistor and a light emitting diode as said display element.

* * * * *